United States Patent
Culler

(10) Patent No.: US 6,906,567 B2
(45) Date of Patent: Jun. 14, 2005

(54) METHOD AND STRUCTURE FOR DYNAMIC SLEW-RATE CONTROL USING CAPACITIVE ELEMENTS

(75) Inventor: Jason Harold Culler, Livermore, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/448,765

(22) Filed: May 30, 2003

(65) Prior Publication Data

US 2004/0239391 A1 Dec. 2, 2004

(51) Int. Cl.$^7$ ............................................... H03K 5/12
(52) U.S. Cl. ........................ 327/170; 327/380; 327/381
(58) Field of Search ............................... 327/170, 112, 327/108, 380, 381, 382, 387, 337, 338; 326/26, 121

(56) References Cited

U.S. PATENT DOCUMENTS

| | | | |
|---|---|---|---|
| 4,499,387 A | 2/1985 | Konishi | 326/15 |
| 5,283,631 A * | 2/1994 | Koerner et al. | 326/121 |
| 5,621,335 A | 4/1997 | Andresen | 326/30 |
| 5,994,922 A | 11/1999 | Aoki et al. | 326/87 |
| 6,172,541 B1 | 1/2001 | Young et al. | 327/170 |
| 6,285,215 B1 | 9/2001 | Voshell | 326/86 |
| 6,566,933 B1 * | 5/2003 | Lye | 327/337 |
| 6,664,805 B2 * | 12/2003 | Gonzalez | 326/26 |

FOREIGN PATENT DOCUMENTS

EP        0980144 A2     2/2000

* cited by examiner

Primary Examiner—My-Trang Nu Ton
Assistant Examiner—Hiep Nguyen

(57) ABSTRACT

A method and structure for providing dynamic control of a slew rate of an electronic circuit. The structure has a signal line that is coupled to a number of capacitive elements that may be selectively switched in or out of the electronic circuit in order to provide precise control of the slew rate of the electronic circuit. A control element switches the capacitive elements into the signal line so that the slew rate may be precisely controlled at one or more time instants. The method includes determining a desired slew rate of the electronic circuit. Based upon the desired value of the slew rate, one or more of the capacitive elements are switched into the signal line at one or more time instants without changing an output impedance of the electronic circuit.

30 Claims, 6 Drawing Sheets

METHOD AND STRUCTURE FOR DYNAMIC SLEW-RATE CONTROL USING CAPACITIVE ELEMENTS

TECHNICAL FIELD

This invention relates generally to the field of electronic circuits, and more specifically to the control of the slew rate of an electronic circuit.

BACKGROUND

The slew rate of a signal path of an electronic circuit determines how fast a signal carried by the signal path can transition from a first state to a second state. These two states are often referred to as 'OFF' and 'ON', or '0' and '1'. The value of the slew rate must be carefully chosen, because a slew rate that is too fast may cause unacceptable circuit ringing and degrade the signal quality. Conversely, a slew rate that is too slow may not meet the design specifications of the electronic circuit. A determination of how fast is too fast or how slow is too slow depends upon the characteristics of the circuit and its intended application.

Control of the slew rate may be achieved by controlling the impedance of a subcircuit containing the signal path. This subcircuit may be the driver circuit of an integrated circuit, for example. Referring now to FIG. 1, a driver slew rate control circuit that controls the slew rate by changing an impedance of the control circuit is shown, according to the prior art. Impedance control circuitry 115 uses off-chip Process-Voltage-Temperature (PVT) information 135 and on-chip PVT information to determine an amount of impedance to apply to output data 105. Pre-driver circuitry 120 uses an output enable signal 110 to determine when output data 105 requires slew rate control. Pre-driver circuitry 120 is coupled to transistors (represented as transistors 145, 150, 155) and pull-down transistors (represented as transistors 160, 165, 170). The pull-up transistors (145, 150, 155) and the pull-down transistors (160, 165, 170) operate on output data 105 to produce output signal 175 with a specified slew rate performance. The slew rate performance is determined by one or more circuit specifications and the off-chip PVT information 135 and on-chip PVT information 140. Note that the complexity of the slew rate control is compounded by the use of impedance control using the pull-up transistors (145, 150, 155) and the pull-down transistors (160, 165, 170). Impedance control requires the off-chip PVT information 135 and on-chip PVT information 140 since the pull-up transistors (145, 150, 155) and the pull-down transistors (160, 165, 170) are affected by variations in process of manufacture, temperature and voltage.

SUMMARY

A method and structure for providing dynamic control of a slew rate of an electronic circuit is disclosed. According to a structure of the present invention a signal line is coupled to capacitive elements. Each capacitive element may be selectively switched in or out of the electronic circuit in order to provide precise control of the slew rate of the electronic circuit. The determination of which capacitive elements to switch is determined by a control element coupled to the capacitive elements. The control element switches the capacitive elements into the signal line so that the slew rate may be precisely controlled at one or more time instants. According to a method of the present invention, the slew rate is selectively controlled without changing an output impedance of the circuit. The desired slew rate of the electronic circuit is determined.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

DETAILED DESCRIPTION

Figure 1:
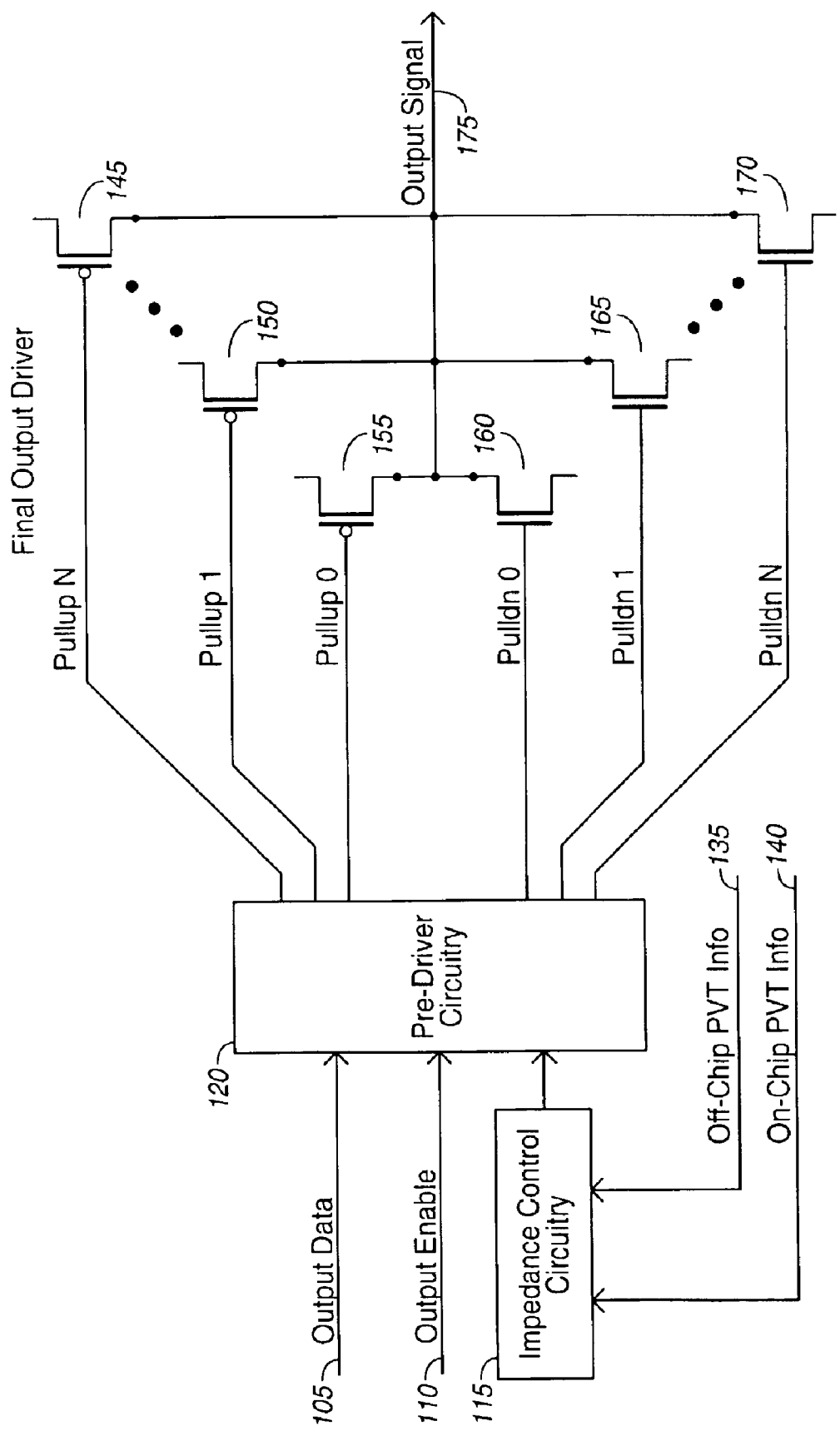
FIG. 1 is a control circuit that controls a slew rate of an electronic circuit by changing the control circuit impedance, according to the prior art.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

Figure 2:
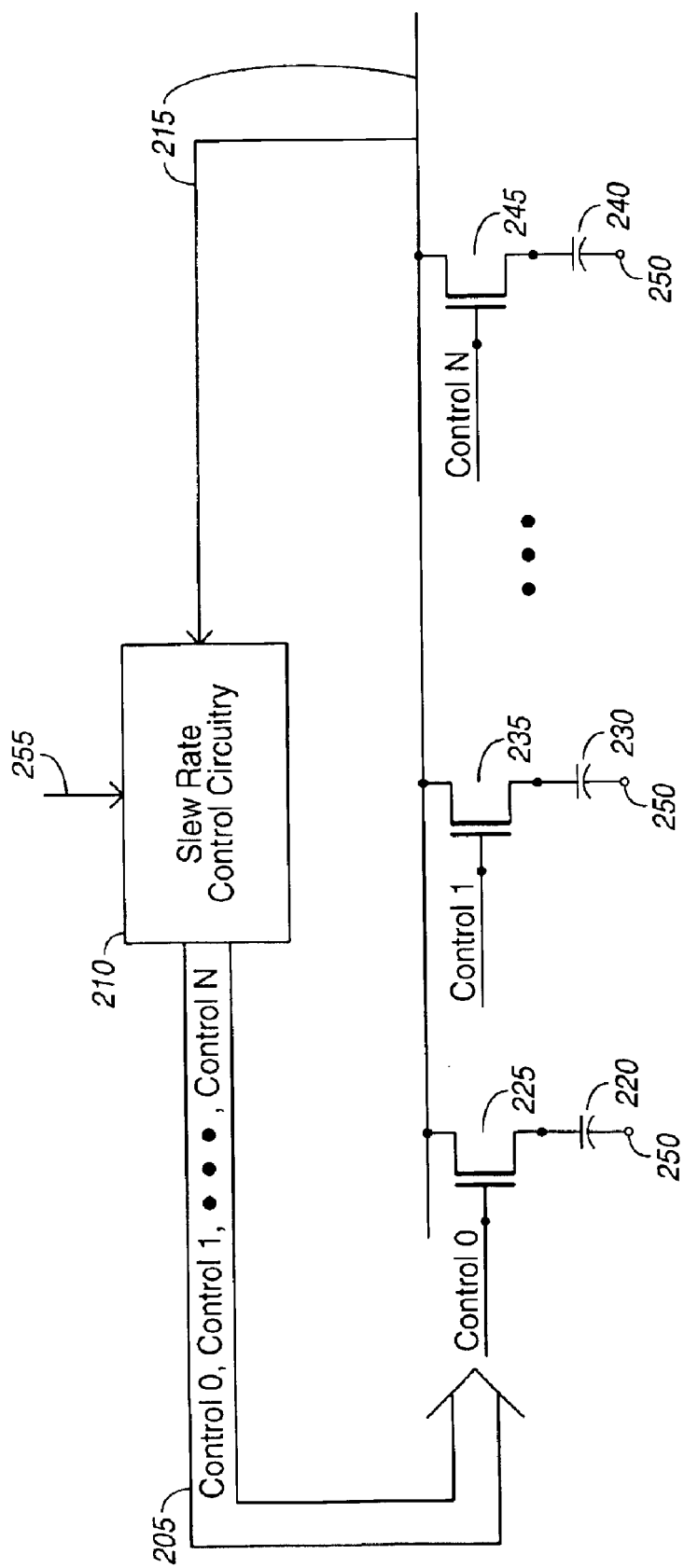
FIG. 2 is a control circuit that controls a slew rate of an electronic circuit by using one or more capacitive elements, in accordance with certain embodiments of the present invention.

Referring now to FIG. 2, a control circuit structure 200 that controls a slew rate of an electronic circuit by using one or more capacitive elements is shown, according to a certain embodiment of the present invention. Slew rate control circuitry 210 generates control outputs 205 that are applied to transistive elements (represented as elements 225, 235, 245). Drive signal 255 is usable by slew rate control circuitry 210 in specifying a desired slew rate of the electronic circuit. In certain embodiments of the present invention, slew rate control circuitry is operable to determine a desired slew rate of the electronic circuit from the slew rate controlled line 215. Transistive elements 225, 235, 245 are coupled to slew rate-controlled line 215 at a corresponding first terminals. Transistive elements 225, 235, 245 are coupled to a corresponding capacitive elements (represented as elements 220, 230, 240) at a corresponding second terminals. Capacitive elements 220, 230, 240 are further coupled to ground. The slew rate controlled line 215 is also coupled to slew rate control circuitry 210 at a first location. In a certain embodiment of the present invention, the transistive elements 225, 235, 245 are coupled to slew rate controlled line 215 at a second location that is different from the first location. It is noted that slew rate control circuitry 210 could be located within the electronic circuit or on an external circuit without departing from the spirit and scope of the present invention. Slew rate control circuitry 210 comprises one or more counters and one or more level detectors operable to detect one or more amplitudes of the slew rate controlled line 215 and one or more counters, said amplitudes operable to determine which ones of the capacitive elements 220, 230, 240 are switched into the slew rate controlled line 215.

Slew rate control circuitry 210 generates control outputs 205 in order to dynamically control a slew rate of slew rate controlled line 215. The control outputs 205 are used to couple one or more of the capacitive elements 220, 230, 240 to slew rate-controlled line 215. Capacitive elements 220, 230, 240 adjust the slew rate of slew rate controlled line 215. The adjusted slew rate of slew rate controlled line 215 is then coupled to slew rate control circuitry 210. Slew rate control circuitry 210 then generates control outputs 205 based upon the adjusted slew rate. This process continues until the slew rate of slew rate controlled line 215 is within a tolerance of a desired slew rate.

Figure 6:
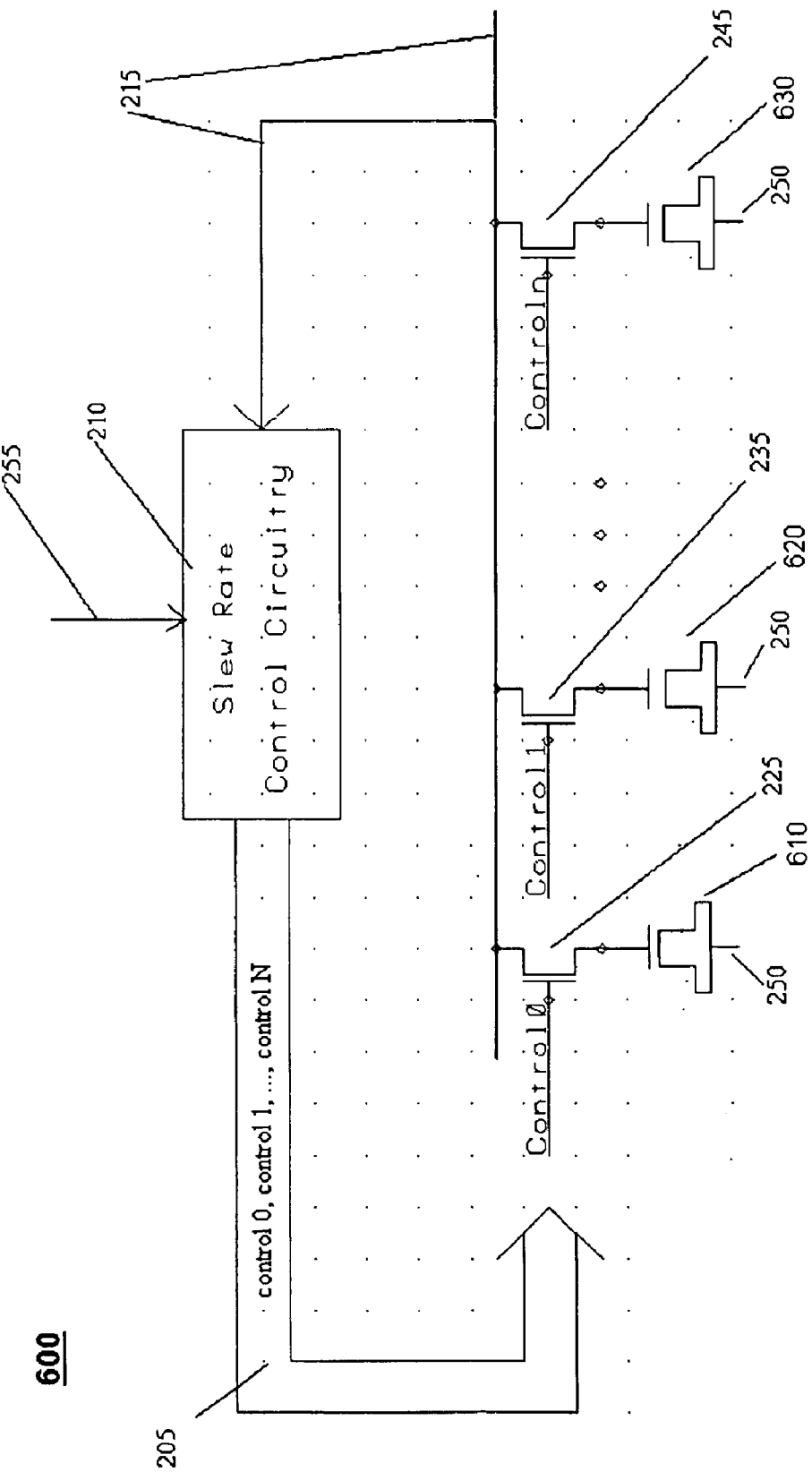
FIG. 6 is a control circuit that controls a slew rate of an electronic circuit by using one or more capacitive elements, in accordance with certain embodiments of the present invention.

It is noted that one of skill in the art will recognize that the circuit of FIG. 2 may be applied to digital circuits, integrated circuits, or analog circuits without departing from the spirit and scope of the present invention. In a certain embodiment of the present invention, capacitive elements 220, 230, 240 are capacitors and transistive elements 225, 235, 245 are Field Effect Transistors (FET's). Referring to FIG. 6, a control circuit structure 200 that controls a slew rate of an electronic circuit by using one or more capacitive elements is shown, according to a certain embodiment of the present invention. In this embodiment, it can be seen that the capacitive elements are transistors 610, 620, 630 without departing from the spirit and scope of the present invention as the transistors have capacitive properties. Transistors 610, 620, 630 are coupled to ground 250 as in FIG. 2.

Figure 3:
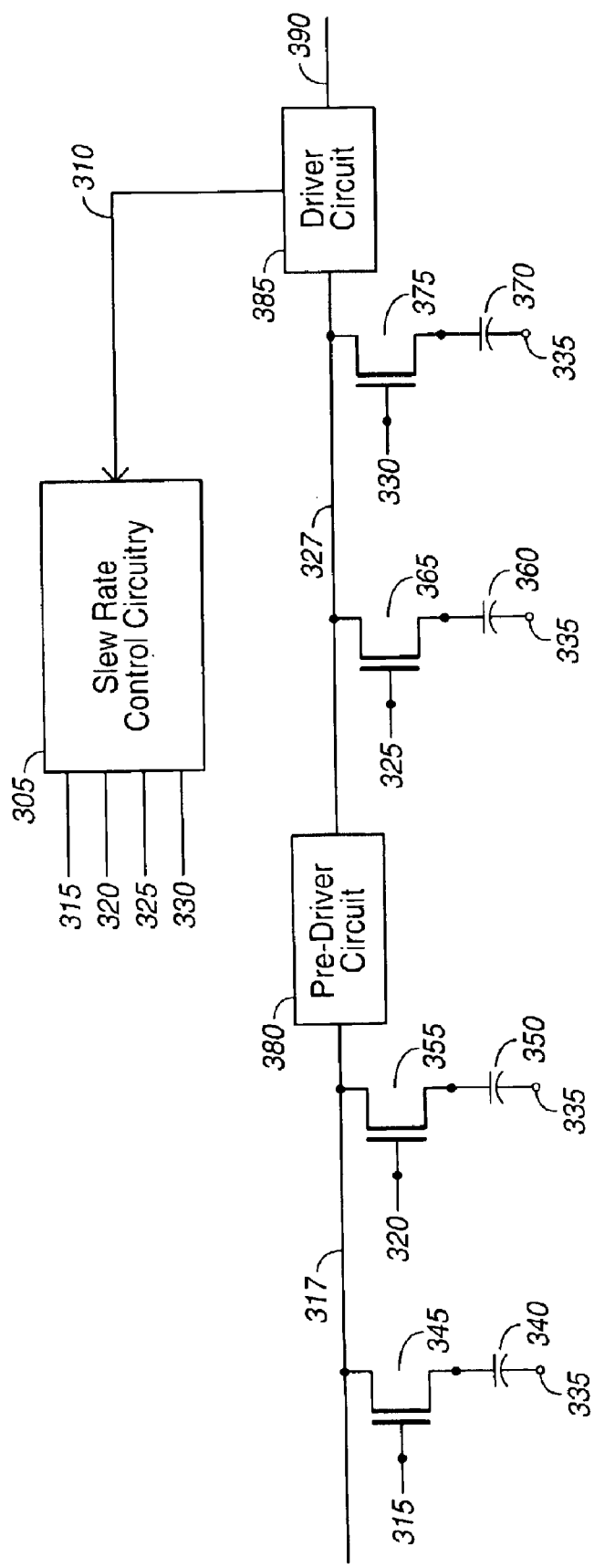
FIG. 3 is a control circuit that controls a slew rate of an electronic circuit by using one or more capacitive elements placed in one or more locations of the electronic circuit, in accordance with certain embodiments of the present invention.

Referring now to FIG. 3, a slew rate control circuit 300 is shown that controls a slew rate of an electronic circuit by using one or more capacitive elements placed in one or more locations of the electronic circuit, according to a certain embodiment of the present invention. Although FIG. 3 describes slew rate control of an output driver circuit, other types of electronic circuits could be present without departing from the spirit and scope of the present invention. As an example, the approach of FIG. 3 could be used for slew rate control of sensitive signal lines. Slew rate control circuitry 305 generates control signals 315, 320, 325, 330. It is noted that slew rate control circuitry 305 could be located within the electronic circuit or on an external circuit without departing from the spirit and scope of the present invention. Slew rate control circuitry 305 comprises one or more counters and one or more level detectors operable to detect one or more amplitudes of feedback signal 310 and one or more counters, said amplitudes operable to be determine which ones of the capacitive elements 220, 230, 240 are switched to effect output signal 390. Separate driver circuit input? Control signal 315 is coupled to transistive element 345 at a first terminal, wherein transistive element 345 is further coupled to capacitive element 340 at a second terminal. Capacitive element 340 is also coupled to ground 335. A third terminal of transistive element 345 is coupled to signal line 317. Similarly, control signal 320 is coupled to transistive element 355 at a first terminal, wherein transistive element 355 is further coupled to capacitive element 350 at a second terminal. Capacitive element 350 is also coupled to ground 335. A third terminal of transistive element 355 is coupled to signal line 317. Signal line 317 is then coupled to pre-driver circuit 380. Pre-driver circuit 380.operates on signal line 317 to produce a second signal line 327. Second signal line 327 is then coupled a first terminal of transistive element 365 and coupled to a first terminal of transistive element 375. Transistive element 365 and transistive element 375 receive as input corresponding control signal 325 and control signal 330. Transistive element 365 and transistive element 375 are also coupled to corresponding capacitive element 360 and capacitive element 370 through a second terminal of transistive element 365 and a second terminal of transistive element 375. Capacitive element 360 and capacitive element 370 are also coupled to ground 335.

After coupling to transistive element 365 and transistive element 375, second signal line 327 is an input to driver circuit 385. Driver circuit 385 produces output signal 390 and feedback signal 310, which is an input to slew rate control circuitry 305. It is noted that feedback signal 310 may be substantially similar to output signal 390, or feedback signal 310 may be a version of output signal 390 that has been additionally processed. Feedback signal 310 is operable to be used by slew rate control circuitry 305 to generate control signals 315, 320, 325, 330. Control signals 315, 320, 325, 330 are then used to switch in or out capacitive elements 340, 350, 360, 370 so that a slew rate of output signal 390 has a desired value. It is noted that although four capacitive elements are shown in FIG. 3, a greater or a lesser number of capacitive elements could be present without departing from the spirit and scope of the present invention. It is also noted that although capacitive elements are shown in two locations operable to provide slew rate control, capacitive elements could be provided in more than two locations without departing from the spirit and scope of the present invention. In a certain embodiment of the present invention, feedback signals provided to slew rate control circuitry 305 could include one or more of feedback signal 310, signal line 317, and second signal line 327.

Figure 4:
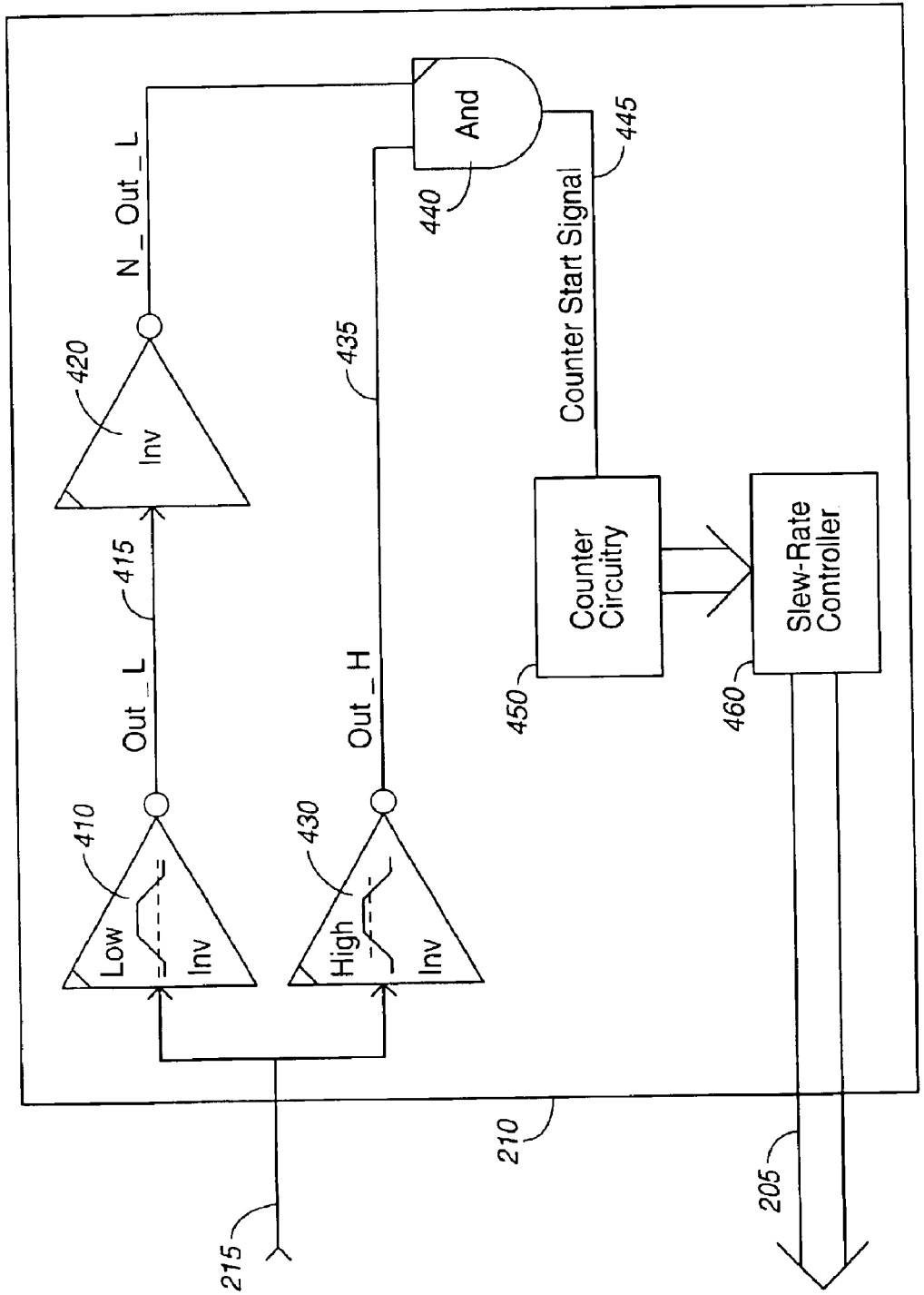
FIG. 4 is a block diagram of an exemplary slew rate control circuit, in accordance with certain embodiments of the present invention.

It is noted that slew rate control circuitry 210 may be implemented using techniques understood by one of skill in the art. Referring now to FIG. 4, a block diagram 400 of one example of slew rate control circuitry 210 is shown, in accordance with certain embodiments of the present invention. Slew rate controlled line 215 is coupled to a low inverter 410 and a high inverter 430 of slew rate control circuitry 210. Low inverter 410 and high inverter 430 are operable to be used as level detectors. An inverter 420 and AND gate 440 are the used to generate a counter start signal 445, wherein counter start signal 445 is operable to start or stop counter circuitry 450. Counter start signal 450 is input to counter circuitry 450 which is coupled to slew rate controller 460. Counter start signal 450 is operable to count a rising and falling of slew rate controlled line 215. Slew rate controller 460 compares timing information provided by counter circuitry 450 and determines if the slew rate should be adjusted.

Figure 5:
FIG. 5 is a timing diagram of an exemplary slew rate control circuit, in accordance with certain embodiments of the present invention.

Referring now to FIG. 5, a timing diagram 500 of the example of slew rate control circuitry 210 is shown, in accordance with certain embodiments of the present invention. It is also noted that slew rate controller 460 may determine a slew rate adjustment by using values of internal registers of slew rate control circuitry 210 or may compare the timing information provided by counter circuitry 450 to a predetermined threshold. While signal 205 is not shown in the figure, the relationship between signal 205, 215, 415, 435, and 445 is further illustrated by reference to FIG. 4.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A structure for providing a dynamic slew rate control of a slew rate of an electronic circuit, comprising:

a signal line;

a plurality of capacitive elements operable to be coupled to the signal line, wherein each capacitive element of the plurality of capacitive elements are operable to be selectively switched in or out of the signal line; and a control circuit coupled to the plurality of capacitive elements via a plurality of switchable elements, wherein said control circuit is operable to selectively switch in or out one or more of the plurality of capacitive elements at one or more time instants, wherein the control circuit further comprises one or more counters and one or more level detectors operable to detect one or more amplitudes of the signal line and the one or more counters, said amplitudes useable to determine which ones of the plurality of capacitive elements are switched into the electronic circuit.

2. The structure of claim 1, wherein the plurality of capacitive elements are located in one or more points within the electronic circuit.

3. The structure of claim 1, wherein the electronic circuit comprises one or more of a driver circuit, an on-chip signal line, and a pre-driver circuit.

4. The structure of claim 1, wherein the plurality of capacitive elements are capacitors coupled to a ground.

5. The structure of claim 1, wherein the plurality of capacitive elements are transistors coupled to a ground.

6. The structure of claim 1, wherein the dynamic slew rate control is controlled by a controller external to the electronic circuit.

7. The structure of claim 1, wherein an output impedance of the electronic circuit is not changed as the slew rote is changed.

8. The structure of claim 1, wherein the control circuit selectively switches out the one or more capacitive elements at one or more time instants using a plurality of transistive elements coupled to the corresponding plurality of capacitive elements.

9. The structure of claim 1, wherein the slew rate of the electronic circuit is dynamically changed by the control circuit selectively changing which ones of the plurality of capacitive elements are switched into the electronic circuit at one or more time instants.

10. The structure of claim 1, wherein one or more signal line amplitudes are used to selectively adjust slew rate to control ringing.

11. The structure of claim 1, wherein a feedback line is coupled to a control circuit input and coupled to the signal line after the coupling of the signal line to the plurality of capacitive elements, wherein said feedback line has a feedback signal operable to be used to determine which ones of the plurality of capacitive elements are switched into the electronic circuit.

12. The structure of claim 11, wherein the feedback signal monitors one or more measurable characteristics of the output signal line and causes the control circuit to dynamically change the slew rate, wherein said one or more measurable characteristics include one or more of:

slew rate;

rise time;

fall time; and amplitude.

13. A structure for providing a dynamic slew rate control of an electronic circuit without changing an output impedance of the electronic circuit, comprising:

a signal line of an electronic circuit;

a plurality of capacitive elements coupled to the signal line; and a control circuit, coupled to the plurality of capacitive elements via a plurality of switchable elements, and further coupled to the signal line, wherein said control circuit is operable to dynamically change the slew rate at one or more time instants, wherein the control circuit further comprises one or more counters and one or more level detectors operable to detect one or more amplitudes of the signal line and the one or more counters, said amplitudes useable to determine which ones of the plurality of capacitive elements are switched into the electronic circuit.

14. The structure of claim 13, wherein the electronic circuit comprises one or more of a driver circuit, an on-chip signal line, and a pre-driver circuit.

15. The structure of claim 13, wherein the plurality of capacitive elements are capacitors coupled to a ground.

16. The structure of claim 13, wherein the plurality of capacitive elements are transistors coupled to a ground.

17. The structure of claim 13, wherein the slew rate is controlled externally relative to the electronic circuit.

18. The structure of claim 13, wherein the slew rate of the electronic circuit is changed by the control circuit changing which ones of the plurality of capacitive elements are switched into the electronic circuit.

19. The structure of claim 13, wherein the plurality of capacitive elements are coupled to a corresponding plurality of transistive elements, wherein said plurality of transistive elements are operable to switch one or more of the plurality of capacitive elements into the signal line.

20. The structure of claim 13, wherein a feedback line is coupled to a control circuit input and coupled to the signal line after the coupling of the signal line to the plurality of capacitive elements, wherein said feedback line has a feedback signal operable to be used to determine which ones of the plurality of capacitive elements are switched into the electronic circuit.

21. The structure of claim 20, wherein one or more amplitudes of the feedback signal are operable be used to selectively adjust slew rate to control ringing.

22. The structure of claim 21, wherein the feedback signal monitors one or more measurable characteristics of the output signal line and causes the control circuit to dynamically change the slew rate, wherein said one or more measurable characteristics include one or more of:

slew rate;

rise time;

fall time; and amplitude.

23. A method for selectively controlling a slew rate of a circuit, comprising:

determining a desired slew rate of the circuit; and selectively switching one or more of a plurality of capacitive elements at one or more time instants to achieve the desired slew rate without changing an output impedance of the circuit, wherein a feedback signal is used to determine which of the plurality of capacitive elements are switched into the circuit by a control circuit coupled to the capacitive elements and wherein one or more counters and one or more level detectors of the control circuit are operable to detect one or more amplitudes that are useable to determine which of the plurality of capacitive elements are switched into the circuit.

24. The method of claim 23, wherein determining the desired slew rate of the circuit comprises comparing the slew rate to a predetermined threshold.

25. The method of claim 23, further comprising measuring the slew rate, and if the measured slew rate is not within a tolerance value of the desired slew rate, repeating the selective switching one or more of the plurality of capacitive elements.

26. The method of claim 25, further comprising comparing an absolute value of a difference between the measured slew rate and the desired slew rate to the tolerance value.

27. The method of claim 23, wherein determining the desired slew rate further comprises monitoring one or more measurable characteristics of a signal line of the circuit.

28. The method of claim 27, wherein the one or more measurable characteristics include one or more of:

slew rate;

rise time:

fall time; and amplitude.

29. A structure, comprising:

a signal line of an electronic circuit;

a plurality of capacitive elements operable to be coupled to the signal line;

a control circuit coupled to the plurality of capacitive elements, wherein said control circuit is operable to selectively switch in or out one or more of the plurality of capacitive elements at one or more time instants; and wherein the control circuit further comprises one or more counters and one or more level detectors operable to detect one or more amplitudes of the signal line and the one or more counters, said amplitudes useable to determine which ones of the plurality of capacitive elements are switched into the electronic circuit; and a means for achieving a desired slew rate by selectively switching in or out of the signal line one or more of the plurality of capacitive elements at one or more time instants.

30. The structure of claim 29, wherein the one or more capacitive elements are selectively switched out of the signal line without substantially changing an output impedance of the electronic circuit.

* * * * *

UNITED STATES PATENT AND TRADEMARK OFFICE
CERTIFICATE OF CORRECTION

PATENT NO. : 6,906,567 B2  Page 1 of 1
APPLICATION NO. : 10/448765
DATED : June 14, 2005
INVENTOR(S) : Jason Harold Culler It is certified that error appears in the above-identified patent and that said Letters Patent is hereby corrected as shown below:

In column 5, line 41, in Claim 7, delete "rote" and insert -- rate --, therefor.

In column 7, line 23, in Claim 28, after "time" delete ":" and insert -- ; --, therefor.

Signed and Sealed this

Fourth Day of August, 2009

JOHN DOLL
*Acting Director of the United States Patent and Trademark Office*